US009298095B2

(12) United States Patent
Wang et al.

(10) Patent No.: US 9,298,095 B2
(45) Date of Patent: Mar. 29, 2016

(54) RINSE SOLUTION FOR LITHOGRAPHY AND PATTERN FORMATION METHOD EMPLOYING THE SAME

(75) Inventors: Xiaowei Wang, Shizuoka (JP); Georg Pawlowski, Shizuoka (JP); Yuriko Matsuura, Shizuoka (JP)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 14/003,840

(22) PCT Filed: Mar. 22, 2012

(86) PCT No.: PCT/JP2012/057350
§ 371 (c)(1),
(2), (4) Date: Sep. 9, 2013

(87) PCT Pub. No.: WO2012/128322
PCT Pub. Date: Sep. 27, 2012

(65) Prior Publication Data
US 2014/0234783 A1    Aug. 21, 2014

(30) Foreign Application Priority Data
Mar. 23, 2011  (JP) ................. 2011-064003

(51) Int. Cl.
*G03F 7/40*   (2006.01)
*G03F 7/20*   (2006.01)
*G03F 7/00*   (2006.01)
*H01L 21/02*  (2006.01)

(52) U.S. Cl.
CPC ............... *G03F 7/40* (2013.01); *G03F 7/0007* (2013.01); *G03F 7/2041* (2013.01); *H01L 21/0206* (2013.01)

(58) Field of Classification Search
CPC ......... G03F 7/32; G03F 7/0392; G03F 7/322; G03F 7/0045; G03F 7/0395
USPC ..................... 430/270.1, 302, 434
See application file for complete search history.

(56) References Cited

U.S. PATENT DOCUMENTS

| | | | | |
|---|---|---|---|---|
| 3,515,649 A * | 6/1970 | Hepfer | ........................... | 205/164 |
| 4,329,422 A * | 5/1982 | Langlais | ...................... | 430/331 |
| 5,977,041 A | 11/1999 | Honda | | |
| 6,313,078 B1 | 11/2001 | Tsuboi | | |
| 6,451,510 B1 | 9/2002 | Messick et al. | | |
| 2002/0146645 A1* | 10/2002 | Tachikawa et al. | ........ | 430/271.1 |
| 2004/0029395 A1 | 2/2004 | Zhang et al. | | |
| 2004/0146315 A1* | 7/2004 | Ueda et al. | ..................... | 399/159 |
| 2005/0266349 A1* | 12/2005 | Van Damme et al. | ........ | 430/300 |
| 2005/0284502 A1 | 12/2005 | Watanabe et al. | | |
| 2006/0124586 A1* | 6/2006 | Kobayashi et al. | ............. | 216/41 |
| 2007/0072112 A1* | 3/2007 | Prokopowicz et al. | .... | 430/270.1 |
| 2009/0145347 A1* | 6/2009 | Nakamura et al. | ............ | 116/216 |
| 2010/0248164 A1 | 9/2010 | Kumagai et al. | | |
| 2011/0304674 A1* | 12/2011 | Sambhy et al. | .................. | 347/84 |
| 2013/0164694 A1* | 6/2013 | Wang et al. | .................... | 430/325 |

FOREIGN PATENT DOCUMENTS

| | | | |
|---|---|---|---|
| JP | 4-318853 A | | 11/1992 |
| JP | 5-299336 A | | 11/1993 |
| JP | 7-140674 A | | 6/1995 |
| JP | 8-272083 A | | 10/1996 |
| JP | 2000-112148 A | | 4/2000 |
| JP | 2001-517728 A | | 10/2001 |
| JP | 2002-323773 A | | 11/2002 |
| JP | 2004-78217 A | | 3/2004 |
| JP | 2004-184648 A | | 3/2004 |
| JP | 2006-11054 A | | 1/2006 |
| JP | 2007-254510 A | | 10/2007 |
| JP | 2008-146099 A | | 8/2008 |
| JP | 2008-180895 A | | 8/2008 |
| JP | 2008208071 A | * | 9/2008 |
| JP | 2010-256849 A | | 11/2010 |
| WO | WO 2007/108186 A1 | | 9/2007 |

OTHER PUBLICATIONS

Machine Language English Abstract from JPO of JP 4-318853 A, Oct. 11, 2012.

* cited by examiner

*Primary Examiner* — Chanceity Robinson
(74) *Attorney, Agent, or Firm* — Mitchell Brustein

(57) ABSTRACT

The present invention provides a rinse solution for lithography and a pattern formation method using the solution. They can improve the pattern collapse, surface roughness and surface defects. The solution contains at least a sulfonic acid a nonionic surfactant having an alkyleneoxy group and water.

17 Claims, No Drawings

RINSE SOLUTION FOR LITHOGRAPHY AND PATTERN FORMATION METHOD EMPLOYING THE SAME

This application is a United States National Stage Patent Application under 35 U.S.C. §371 of International Patent Application No. PCT/JP2012/057350, filed Mar. 22, 2012, which claims priority to Japanese Patent Applications No. 2011-064003, filed Mar. 23, 2011, the contents of both documents being hereby incorporated herein by reference.

TECHNICAL FIELD

The present invention relates to a rinse solution for lithography. Specifically, this invention relates to a rinse solution suitable for development of a photosensitive resin composition used in a lithographic process for manufacturing semiconductor devices, color filters, flat panel displays (FPDs) such as liquid crystal displays, and the like. The present invention also relates to a pattern formation method employing the above rinse solution.

BACKGROUND ART

Hitherto, photolithography has been adopted for microfabrication or for formation of fine elements in extensive fields including the manufacture of semiconductor integrated circuits such as LSIs, the preparation of FPD screens, and the production of circuit boards for color filters, thermal heads and the like. In the photolithography, a positive- or negative-working photosensitive resin composition is employed for resist pattern formation. Widely used examples of the positive-working photoresist include a photosensitive resin composition comprising an alkali-soluble resin and a photosensitive substance of quininediazide compound.

Meanwhile, according as the integration degree of LSIs has needed to be increased more and more recently, it has been required to increase fineness of resist patterns. In order to meet this requirement, it is becoming practical for a lithographic process to use radiation of shorter wavelength such as an extreme ultraviolet (EUV) ray (13 nm), a KrF excimer laser beam (248 nm), an ArF excimer laser beam (193 nm), an X-ray, an electron beam or the like. For coping with finer fabrication, the photoresist used in microfabrication must be a photosensitive resin composition capable of giving a pattern of high resolution. Further, it is also desired that the photosensitive resin composition be improved not only in resolution but also in sensitivity and in accuracy on shape and dimension of the pattern. In view of that, a "chemically amplified photosensitive resin composition" is proposed as a radiation-sensitive resin composition having sensitivity to the radiation of short wavelength and giving a pattern of high resolution. The chemically amplified photosensitive resin composition comprises a compound that generates an acid when exposed to radiation, and hence when the radiation is applied, the compound generates an acid and the acid serves as a catalyst in image-formation to improve sensitivity. Because of its high sensitivity, the chemically amplified photosensitive resin composition is becoming widely used in place of conventional photosensitive resin compositions.

However, in accordance with increasing the fineness in pattern fabrication as described above, problems such as pattern collapse and pattern roughness are liable to get worse. To cope with those problems, various methods have been researched. For example, it is studied to change or improve components of the resist compositions.

When a resist pattern is washed with pure water after development, the surface tension of pure water may apply negative pressure on the pattern. This is thought to be a cause of the pattern collapse. Based on this thought, it is proposed to wash the pattern not with pure water but with a rinse solution containing a particular component (see, Patent documents 1 to 4). Those patent documents propose rinse solutions for lithography, and the proposed solutions contain particular nonionic surfactants.

[Patent document 1] Japanese Patent Laid-Open No. 2004-184648
[Patent document 2] Japanese Patent Laid-Open No. 05(1993)-299336
[Patent document 3] Japanese Patent Laid-Open No. 07(1995)-140674
[Patent document 4] Japanese Patent Laid-Open No. 2008-146099

DISCLOSURE OF INVENTION

Problem to be Solved by the Invention

However, although the solutions described in the above documents somewhat reduce the pattern collapse, they are still desired to be improved. Further, with respect to defects and roughness on the developed resist surface, there is much room for improvement in the above solutions. Accordingly, it is desired to provide such a rinse solution for lithography or a resist substrate treatment method as can solve the problems of the pattern collapse, the surface defects and the surface roughness at the same time.

Means for Solving Problem

The present invention resides in a rinse solution for lithography, which comprises at least a sulfonic acid, a nonionic surfactant having an alkyleneoxy group, and water.

The present invention also resides in a pattern formation method comprising the steps of:
(1) coating a substrate with a photosensitive resin composition to form a photosensitive resin composition layer,
(2) subjecting said photosensitive resin composition layer to exposure,
(3) developing the exposed substrate with a developing solution, and
(4) treating the substrate with the above rinse solution for lithography.

Effect of the Invention

The rinse solution of the present invention for lithography enables to prevent a resist pattern from collapsing, to remove defects on the resist pattern and to improve roughness on the pattern surface. Specifically, even defects formed on a pattern of immersion resist, which is liable to suffer from defects because of containing a fluorine-containing polymer to enlarge the contact angle, can be effectively removed with the rinse solution according to the present invention.

BEST MODE FOR CARRYING OUT THE INVENTION

Embodiments of the present invention are described below in detail.

The rinse solution for lithography according to the present invention comprises at least a sulfonic acid, a nonionic surfactant having an alkyleneoxy group and water.

There is no particular restriction on the sulfonic acid used in the present invention, as long as it contains a sulfo group (—SO$_3$H). The sulfonic acid is, for example, represented by the following formula (I):

R—SO$_3$H (I)

in which R is a 1 to 30 carbon atom-hydrocarbon group which may have a chain or cyclic structure, may have a branched chain, and may comprise a double or triple bond, provided that some or all of the hydrogen atoms in the hydrocarbon group may be replaced with halogen atoms, hydroxides, sulfo groups or carboxyls.

A preferred example of the sulfonic acid is represented by the following formula (Ia):

C$_n$H$_{2n+1-x}$F$_x$SO$_3$H (Ia)

in which n is an integer of 1 to 30, preferably 8 to 20, more preferably 10 to 18; and x is an integer satisfying the condition of 0≤x≤2n+1.

Specific examples of the sulfonic acid which is preferred in the present invention include t-butyl sulfonic acid, n-hexyl sulfonic acid, cyclohexyl sulfonic acid, octyl sulfonic acid, nonyl sulfonic acid, decyl sulfonic acid, dodecyl sulfonic acid, tetradecyl sulfonic acid, hexadecyl sulfonic acid, icosenyl sulfonic acid, 1-hydroxy-n-octyl sulfonic acid, 1,8-disulfo octane, perfluorodecyl sulfonic acid, and the like. Especially, octyl sulfonic acid, decyl sulfonic acid, dodecyl sulfonic acid and hexadecyl sulfonic acid are preferred in terms of solubility to water and availability.

Another preferred example of the sulfonic acid is represented by the following formula (Ib):

(R$^1$)$_y$-Ph-SO$_3$H (Ib)

in which Ph is a phenylene group; R$^1$ is a hydrogen atom or the above hydrocarbon group which may have a chain or cyclic structure, may have a branched chain, and may comprise a double or triple bond, provided that some or all of the hydrogen atoms in the hydrocarbon group may be replaced with halogen atoms, hydroxides, sulfo groups or carboxyls; y is an integer satisfying the condition of 0≤y≤5; if y is 2 or more, plural R$^1$s may be the same or different from each other; and the total number of carbon atoms is 30 or less, preferably 20 or less.

Specific examples of the sulfonic acid which is preferred in the present invention include toluene sulfonic acid, cumene sulfonic acid, p-octylbenzene sulfonic acid, p-decylbenzene sulfonic acid, p-dodecylbenzene sulfonic acid, 4-octyl-2-phenoxybenzene sulfonic acid, sulfosalicylic acid, 4-carboxybenzene sulfonic acid, and the like. Especially, p-octylbenzene sulfonic acid, and p-decylbenzene sulfonic acid are preferred in terms of solubility to water and availability.

Still another preferred example of the sulfonic acid is represented by the following formula (Ic):

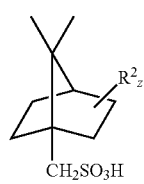
(Ic)

in which R$^2$ is a hydrogen atom or the above hydrocarbon group which may have a chain or cyclic structure, may have a branched chain, and may comprise a double or triple bond, provided that some or all of the hydrogen atoms in the hydrocarbon group may be replaced with halogen atoms, hydroxides, sulfo groups, carboxyls or the like; or otherwise R$^2$ may be an oxygen atom connecting via a double bond to a carbon atom constituting the ring; z is an integer satisfying the condition of 0≤z≤5; if z is 2 or more, plural R$^2$s may be the same or different from each other; and the total number of carbon atoms is 30 or less, preferably 20 or less.

Specific examples of the sulfonic acid which is preferred in the present invention include campher sulfonic acid, 3-bromo-10-campher sulfonic acid, 1-sulfoethyl norbornane, and the like. Especially, campher sulfonic acid are preferred in terms of solubility to water and availability.

Those sulfonic acids can be used in combination of two or more, if necessary. If two or more sulfonic acids represented by the formula (Ia) are used in combination, the effect of the present invention is apt to appear strongly. That is hence particularly preferred.

In general, the rinse solution of the present invention contains the sulfonic acid preferably in a higher content because the surface defects are likely to be more decreased and the roughness is likely to be more improved. On the other hand, however, although the pattern collapse is also improved in accordance with increase of the sulfonic acid content, it often gets worse to the contrary if the content is too high. Accordingly, in practice, the sulfonic acid content is properly selected in consideration of the balance and the components of the rinse solution. Specifically, the sulfonic acid content is in the range of preferably 0.005 to 10%, more preferably 0.01 to 5%, most preferably 0.02 to 2%, based on the total weight of the solution. The solution generally contains water, a sulfonic acid and a surfactant as main components, and hence other components are preferably contained in an amount of 1% or less, preferably 0.5% or less based on the total weight of the solution.

The lithographic rinse solution of the present invention further contains a nonionic surfactant. In the present invention, the surfactant improves wettability of the resist surface to the rinse solution, and also it controls the surface tension to prevent the pattern from collapsing and peeling off.

As the nonionic surfactant, particularly preferred is a nonionic surfactant containing an alkyleneoxy group. This surfactant can be represented by the following formula (IIa) or (IIb):

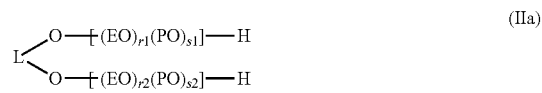
(IIa)

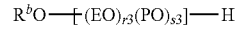
R$^b$O—[(EO)$_{r3}$(PO)$_{s3}$]—H (IIb)

in which EO and PO represent —(CH$_2$)$_2$—O— and —CH$_2$—CH(CH$_3$)—O—, respectively, provided that the units of each of EO and PO may combine with each other either randomly or to form a block.

L is a 1 to 30 carbon atom-hydrocarbon chain which may contain an unsaturated bond. The hydrocarbon chain L is preferably represented by the following formula:

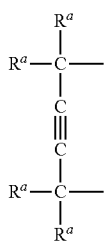

in which each $R^a$ is independently a saturated or unsaturated, straight or branched hydrocarbon chain of 3 to 10 carbon atoms, provided that a hydrogen atom connecting to the carbon atom constituting said hydrocarbon chain may be substituted with —OH. The $R^b$ is a saturated or unsaturated hydrocarbon chain of 5 to 30 carbon atoms. Each of r1 to r3 and s1 to s3 is an integer of 20 or less for indicating the repeating degree of EO and PO, respectively, and each of r1+s1 and r2+s2 is independently an integer of 0 to 20 provided that r1+s1+r2+s2 is an integer of 1 or more. Each of r1+s1 and r2+s2 is preferably an integer of 2 to 10, and r3+s3 is an integer of 1 to 20, preferably 2 to 10.

Specific examples of the nonionic surfactant which is preferred in the present invention include condensation products of hydroxy-containing compound, especially which contains two hydroxy groups, and polyalkylene glycol. As the hydroxyl-containing compounds, saturated or unsaturated aliphatic alcohol, or aliphatic diol is preferred, especially saturated or unsaturated aliphatic diol is preferred. Most preferred hydroxyl-containing coupound is unsaturated aliphatic diol having acetylene bond, i.e., acetylene glycol. If a surfactant produced with the acetylene glycol is used as a rinse solution according to the present invention, pattern collapse is prevented and melting is reduced.

Since strongly preventing the pattern from melting, the above surfactant preferably has high hydrophobicity. Accordingly, L or $R^b$ preferably contains many carbon atoms and the group EO or PO is preferably less repeated because the groups L and $R^b$ are hydrophobic but the groups EO and PO are relatively hydrophilic.

Two or more surfactants can be used in combination, if necessary.

For obtaining the effect of preventing pattern collapse and pattern separation to the maximum degree, the rinse solution of the present invention can contains the surfactant in an amount of, preferably 0.005 to 10%, more preferably 0.01 to 5%, most preferably 0.02 to 2% based on the total weight of the solution.

The rinse solution for lithography according to the present invention comprises water as a solvent, as well as the above sulfonic acid and surfactant. The water is preferably subjected to distillation, ion-exchange treatment, filtration or various adsorption treatments, so as to remove organic impurities, metal ions and the like. Accordingly, pure water is particularly preferred.

The lithographic rinse solution of the present invention may further contain various additives, if necessary. Examples of the additives include acids, bases, and organic solvents.

The acids or bases may be incorporated for controlling the pH value of the solution or for improving the solubility of each component. Any acid or base can be selected to use unless it impairs the effect of the present invention. They are, for example, carboxylic acids, amines or ammonium salts. They include fatty acids, aromatic carboxylic acids, primary amines, secondary amines, tertiary amines and ammonium compounds, each of which may be substituted with any substituent. Concrete examples of them include formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolamine and tetramethylammonium.

In addition to water, an organic solvent can be used as a co-solvent. The organic solvent may have functions of controlling the surface tension of the rinse solution and of improving the wettability thereof to the resist surface. The solvent used for this purpose is selected from water-soluble organic solvents. Examples of the organic solvent include: alcohols such as methanol, ethanol, iso-propanol and t-butyl alcohol; glycols such as ethylene glycol and diethylene glycol; ketones such as acetone and methyl ethyl ketone; esters such as methyl acetate, ethyl acetate and ethyl lactate; dimethyl formamide, dimethyl sulfoxide, methyl cellosolve, cellosolve, butyl cellosolve, cellosolve acetate, alkyl cellosolve acetate, propylene glycol alkyl ether, propylene glycol alkyl ether acetate, butyl carbitol, carbitol acetate, and tetrahydrofuran.

However, the above organic solvent may dissolve or denature the resist of the pattern, and accordingly it must be incorporated in a small amount, if used. The amount thereof is normally 50% or less, preferably 5% or less, more preferably 0.1% or less based on the total weight of the rinse solution. For the purpose of keeping the resist from being dissolved or denatured, it is preferred not to use the organic solvent at all.

The lithographic rinse solution of the present invention can further contain germicides, antibacterial agents, antiseptics and/or antifugal agents. Those substances are used so as to prevent bacteria and fungi from increasing in the rinse solution during storage. Examples of those substances include alcohols such as phenoxy ethanol and isothiazolone, and commercially available BESTCIDEs ([trademark], manufactured by NIPPON SODA CO., LTD.) are particularly effective antiseptics, antifugal agents and germicides. Typically, those substances give no unfavorable effect to the lithographic rinse solution, and the content thereof is 1% or less, preferably 0.1% or less and preferably 0.001% or less based on the total weight of the solution.

The pattern formation method according to the present invention is described below in detail. In the pattern formation method of the present invention, there is no particular restriction on the lithographic process. Accordingly, the lithographic process can be carried out in any known manner of forming a resist pattern from a conventional positive- or negative-working photosensitive resin composition. The following describes a typical pattern formation method employing the lithographic rinse solution of the present invention.

First, a photosensitive resin composition is coated on a surface, which may be pretreated, if necessary, of a substrate, such as a silicon substrate or a glass substrate, according to a known coating method such as spin-coating method, to form a photosensitive resin composition layer. Prior to the coating of the photosensitive resin composition, an antireflection film can be beforehand formed under the photosensitive resin composition layer by coating. The antireflection film can improve the section shape and the exposure margin. After the photosensitive resin composition layer is formed, the antireflection film may be then formed thereon.

Any known photosensitive resin composition can be used in the pattern formation method of the present invention. Representative examples of the compositions usable in the present invention include: a composition comprising a quininediazide type photosensitive substance and an alkali-soluble resin, a chemically amplified photosensitive resin composition (which are positive-working compositions); a composition comprising a photosensitive functional group-containing polymer such as polyvinyl cinnamate, a composition comprising an azide compound such as an aromatic azide compound or a bisazide compound with a cyclized rubber, a composition comprising a diazo resin, a photo-polymerizable composition comprising an addition-polymerizable unsaturated compound, and a chemically amplified negative-working photosensitive resin composition (which are negative-working compositions).

Examples of the quinonediazide type photo-sensitive substance used in the positive-working composition comprising a quinonediazide type photosensitive substance and an alkali-soluble resin include: 1,2-benzoquinonediazide-4-sufonic acid, 1,2-naphthoquinonediazide-4-sufonic acid, 1,2-naphthoquinonediazide-5-sufonic acid, and sufonic esters or amides thereof. Examples of the alkali-soluble resin include: novolak resin, polyvinyl phenol, polyvinyl alcohol, and copolymers of acrylic acid or methacrylic acid. The novolak resin is preferably prepared from one or more phenols such as phenol, o-cresol, m-cresol, p-cresol and xylenol in combination with one or more aldehydes such as formaldehyde and paraformaldehyde.

Either positive- or negative-working chemically amplified photosensitive resin composition can be used in the pattern formation method of the present invention. The chemically amplified resist generates an acid when exposed to radiation, and the acid serves as a catalyst to promote chemical reaction by which solubility to the developing solution is changed within the areas irradiated with the radiation to form a pattern. For example, the chemically amplified photosensitive resin composition comprises an acid-generating compound, which generates an acid when exposed to radiation, and an acid-sensitive functional group-containing resin, which decomposes in the presence of acid to form an alkali-soluble group such as phenolic hydroxyl or carboxyl group. The composition may comprise an alkali-soluble resin, a crosslinking agent and an acid-generating compound.

The photosensitive resin composition layer formed on the substrate is prebaked, for example, on a hot plate to remove solvent contained in the composition, to form a photoresist film of normally 0.05 to 2.5 μm thickness. The prebaking temperature depends on the solvent and the photosensitive resin composition, but is normally 20 to 200° C., preferably 50 to 150° C.

The photoresist film is then subjected to exposure through a mask, if necessary, by known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, baking treatment may be carried out, if necessary, and then development such as paddle development is carried out to form a resist pattern. The resist is normally developed with an alkaline developing solution. Examples of the alkaline developing solution include an aqueous solution of sodium hydroxide or tetramethylammonium hydroxide (TMAH). After the development, the resist pattern is rinsed (washed) with the rinse solution. The thus-formed resist pattern is employed as a resist for etching, plating, ion diffusion or dyeing, and then, if necessary, peeled away.

According to the pattern formation method of the present invention, even a pattern of high fineness and of high aspect ratio can be effectively prevented from collapsing and melting. Here, the term "aspect ratio" means the ratio of height to width in the resist pattern. Accordingly, the method of the present invention is preferably combined with a lithographic process capable of giving a fine resist pattern, such as, a lithographic process comprising exposure at a wavelength of 250 nm or shorter by use of a light source of a KrF excimer laser, an ArF excimer laser, an X-ray irradiation system or an electron beam lithography system. Further, the lithographic process preferably produces a resist pattern having a pattern dimension in which a line width of the line-and-space pattern or a hole diameter of the contact hole pattern is not more than 300 nm, preferably not more than 50 nm.

In the pattern formation method according to the present invention, the resist pattern after developed is treated with the aforementioned rinse solution for lithography. There is no particular restriction on how long the resist substrate is in contact with the rinse solution for lithography, namely, on the treating time. However, the treating time is generally not less than 1 second so as to obtain the effect of the present invention. There is also no particular restriction on how the resist is brought into contact with the rinse solution. For example, the resist substrate may be immersed in the rinse solution, or otherwise the rinse solution may be dropped or sprayed onto the resist substrate while the substrate is being spun.

Further, the pattern formation method of the present invention may comprise washing procedure with pure water after the development. The developed resist pattern may be washed with pure water before and/or after treated with the rinse solution for lithography according to the present invention. The washing with pure water before the treatment with the rinse solution is for the purpose of washing out the developing solution remaining on the resist pattern, and that after the treatment is for the purpose of washing out the rinse solution. The washing with pure water can be carried out in any manner. For example, the resist substrate may be immersed in pure water, or otherwise pure water may be dropped or sprayed onto the resist substrate while the substrate is being spun. The washing with pure water can be performed either or both of before and after the treatment. The washing after the development is preferred because it removes residues of the resist and the developing solution remaining on the substrate and thereby enhances the effect of the invention. On the other hand, the washing after the treatment can remove the rinse solution. Particularly in the case where the resist pattern is treated with the rinse solution of more than 1% concentration, the washing with pure water after the treatment sometimes enables the present invention to show the best effect because it enhances the effect on improvement in preventing the melting. The present invention is further explained by use of the following examples, but they by no means restrict embodiments of the present invention.

Comparative Example 101

A silicon substrate was coated with a bottom anti-reflection layer-forming composition of ArF exposure type (ArF1C5D [trademark], manufactured by AZ Electronic Materials (Japan) K.K.) and heated at 200° C. for 60 seconds, to form an anti-reflection layer of 37 nm thickness. After that, an ArF resist composition (AX2110P [trademark], manufactured by AZ Electronic Materials (Japan) K.K.) was spread thereon to form a layer of 90 nm thickness, and then subjected to baking at 100° C. for 60 seconds to prepare a substrate having a resist layer. The obtained substrate was subjected to exposure by an ArF exposure apparatus (NSR-S306C [trademark], manufactured by Nikon Corporation). After heated at 110° C. for 60 seconds, the resist substrate was developed with aqueous solution of tetramethylammonium hydroxide and then rinsed with pure water to produce a developed resist substrate having line patterns. In the exposure step, the exposure conditions were so varied that the line width might be changed to form plural patterns of different aspect ratios.

The formed patterns were observed by CD-SEM S-9200 ([trademark], manufactured by Hitachi Ltd.) to estimate the maximum aspect ratio that did not cause pattern collapse. As a result of Comparative Example 101, the aspect ratio was 3.0 that did not cause pattern collapse.

Successively, the patterns were also observed with a defect inspection system KLA2115 (trademark], manufactured by

Examples 101 to 107

In addition to the procedure of Comparative Example 101, a rinse treatment was performed by use of the rinse solution containing various sulfonic acids after the development. The substrate was then evaluated. Specifically, the rinse treatment was carried out by dropping the rinse solution containing each sulfonic acid shown in Table 1 onto the resist pattern and then spin-drying the pattern at 1000 rpm for 20 seconds and at 1500 rpm for 10 seconds. The results were as set forth in Table 1.

TABLE 1

| | Rinse solution | | | | Pattern collapse | | | Surface defects | |
|---|---|---|---|---|---|---|---|---|---|
| | Sulfonic acid | Concentration (%) | Surfactant | Concentration (%) | Aspect ratio | Grade | LWR (nm) | Number of foreign substances | Grade |
| Com. 101 | — | — | — | — | 3.0 | C | 5.5 | >10000 | C |
| Ex. 101 | octyl sulfonic acid | 0.5 | S-1 | 0.2 | 5.5 | A | 4.4 | 128 | A |
| Ex. 102 | hexadecanyl sulfonic acid | 0.5 | S-1 | 0.2 | 6.0 | A | 3.9 | 68 | A |
| Ex. 103 | alkyl sulfonic acid mixture* | 0.5 | S-1 | 0.2 | 6.1 | A | 3.9 | 32 | A |
| Ex. 104 | camphor sulfonic acid | 0.5 | S-1 | 0.2 | 4.8 | B | 4.3 | 227 | A |
| Ex. 105 | p-octylbenzene sulfonic acid | 0.5 | S-1 | 0.2 | 5.2 | A | 4.1 | 135 | A |
| Ex. 106 | p-dodecylbenzene sulfonic acid | 0.5 | S-1 | 0.2 | 5.1 | A | 4,1 | 172 | A |
| Ex. 107 | alkyl benzene sulfonic acid mixture* | 0.5 | S-1 | 0.2 | 5.1 | A | 4.0 | 145 | A |

KLA-Tencor Corporation), to evaluate line width roughness (hereinafter, often referred to as "LWR") and foreign substances reattached on the pattern surface. As a result of Comparative Example 101, the LWR was 5.5 nm and the number of foreign substances was more than 10000.

Then, rinse solutions according to the present invention were prepared and characteristics of the rinse solutions are evaluated. The used surfactant was a compound represented by the following formula (S-1), (S-2) or (S-3).

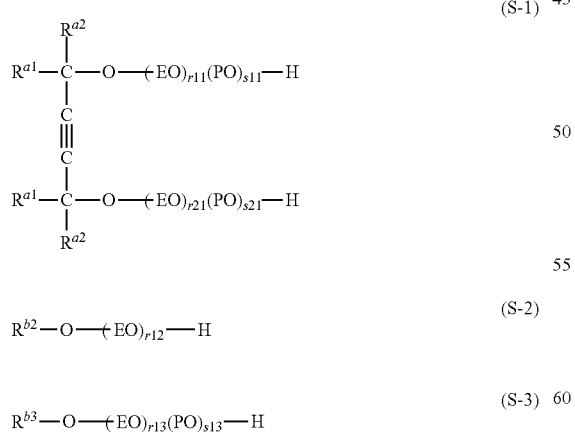

In the above formulas, $R^{a1}$ is methyl, $R^{a2}$ is isobutyl and r11, s11, r21 and s21 are integers satisfying the conditions of r11+r21=5 and s11+s21=2; $R^{b2}$ is $C_{18}H_{37}$ and r12=15; and $R^{b3}$ is $C_{18}H_{37}$, r13=10 and s13=5.

In Table 1, the "alkyl sulfonic acid mixture*" means a mixture of saturated aliphatic sulfonic acids containing 12 to 18 carbon atoms, and the "alkyl benzene sulfonic acid mixture*" means a mixture of alkylbenzene sulfonic acids containing 12 to 18 carbon atoms.

In Table 1, the pattern collapse was evaluated and classified into the following grades:

A: the pattern collapse was caused in an aspect ratio of more than 5.0, and hence was remarkably improved;

B: the pattern collapse was caused in an aspect ratio of 4.0 to 5.0, and hence was somewhat improved; and C: the pattern collapse was caused in an aspect ratio of less than 4.0, and hence was hardly or not at all improved.

Further in Table 1, the surface defects were also evaluated and classified into the following grades:

A: the number of foreign substances was not more than 250;

B: the number of foreign substances was in the range of 250 to 1,000; and

C: the number of foreign substances was more than 1,000.

Comparative Example 201 and Examples 201 to 208, 211 to 216

The procedure of Comparative Example 101 was repeated except for using a rinse solution containing octyl sulfonic acid as the sulfonic acid and compound S-1 as surfactant, to evaluate the patterns. The concentration of the sulfonic acid and S-1 was varied as shown in Table 2. The results were as set forth in Table 2.

TABLE 2

| | Rinse solution | | | | Pattern collapse | | | Surface defects | |
| | Sulfonic acid | Concentration (%) | Surfactant | Concentration (%) | Aspect ratio | Grade | LWR (nm) | Number of foreign substances | Grade |
|---|---|---|---|---|---|---|---|---|---|
| Com. 201 | — | — | — | — | 3.0 | C | 5.5 | >10000 | C |
| Ex. 201 | octyl sulfonic acid | 0.005 | S-1 | 0.2 | 3.8 | B | 5.4 | 2530 | B |
| Ex. 202 | octyl sulfonic acid | 0.01 | S-1 | 0.2 | 4.2 | B | 5.2 | 530 | A |
| Ex. 203 | octyl sulfonic acid | 0.1 | S-1 | 0.2 | 5.0 | B | 4.8 | 246 | A |
| Ex. 204 | octyl sulfonic acid | 0.5 | S-1 | 0.2 | 5.5 | A | 4.4 | 128 | A |
| Ex. 205 | octyl sulfonic acid | 1.0 | S-1 | 0.2 | 5.8 | A | 4.3 | 93 | A |
| Ex. 206 | octyl sulfonic acid | 2.0 | S-1 | 0.2 | 6.1 | A | 4.2 | 90 | A |
| Ex. 207 | octyl sulfonic acid | 5.0 | S-1 | 0.2 | 4.8 | B | 4.0 | 85 | A |
| Ex. 208 | octyl sulfonic acid | 10.0 | S-1 | 0.2 | 4.6 | B | 4.0 | 86 | A |
| Ex. 211 | octyl sulfonic acid | 0.5 | S-1 | 0.005 | 4.9 | B | 5.0 | 896 | B |
| Ex. 212 | octyl sulfonic acid | 0.5 | S-1 | 0.01 | 5.0 | B | 4.8 | 465 | A |
| Ex. 213 | octyl sulfonic acid | 0.5 | S-1 | 0.1 | 5.2 | B | 4.6 | 231 | A |
| Ex. 214 | octyl sulfonic acid | 0.5 | S-1 | 0.2 | 5.5 | A | 4.4 | 128 | A |
| Ex. 215 | octyl sulfonic acid | 0.5 | S-1 | 1.0 | 5.6 | A | 4.4 | 180 | A |
| Ex. 216 | octyl sulfonic acid | 0.5 | S-1 | 2.0 | 5.6 | A | 4.4 | 284 | A |

The criteria for grading the pattern collapse and the surface defects in Table 2 are the same as those described above.

Comparative Examples 301 to 302 and Examples 301 to 306

The procedure of Comparative Example 101 was repeated except for using a rinse solution containing a sulfonic acid and/or a surfactant, to evaluate the patterns. The used surfactant was a compound represented by the formula (S-1), (S-2) or (S-3). The results were as set forth in Table 3.

TABLE 3

| | Rinse solution | | | | Pattern collapse | | | Surface defects | |
| | Sulfonic acid | Concentration (%) | Surfactant | Concentration (%) | Aspect ratio | Grade | LWR (nm) | Number of foreign substances | Grade |
|---|---|---|---|---|---|---|---|---|---|
| Com. 301 | — | — | — | — | 3.0 | C | 5.5 | >10000 | C |
| Com. 302 | — | — | S-1 | 0.2 | 4.8 | B | 4.8 | 580 | B |
| Ex. 301 | hexadecanyl sulfonic acid | 0.5 | — | — | 5.5 | A | 4.0 | 96 | A |
| Ex. 302 | hexadecanyl sulfonic acid | 0.5 | S-1 | 0.2 | 6.1 | A | 3.9 | 68 | A |
| Ex. 303 | hexadecanyl sulfonic acid | 0.5 | S-2 | 0.2 | 5.8 | A | 4.1 | 76 | A |
| Ex. 304 | hexadecanyl sulfonic acid | 0.5 | S-3 | 0.2 | 6.0 | A | 3.9 | 68 | A |
| Ex. 305 | alkyl sulfonic acid mixture | 0.5 | S-1 | 0.2 | 6.1 | A | 3.9 | 32 | A |

Comparative Examples 401 to 402 and Example 401

The procedure of Comparative Example 101 was repeated except for using a KrF resist composition, to evaluate a pattern rinsed with pure water (Comparative Example 401). Specifically, a substrate having a resist layer was prepared in the following manner. A silicon substrate was coated with a bottom anti-reflection layer-forming composition of KrF exposure type (KrF-17B [trademark], manufactured by AZ Electronic Materials (Japan) K.K.), to form an anti-reflection layer of 80 nm thickness. After that, an KrF resist composition (DX6270 [trademark], manufactured by AZ Electronic Materials (Japan) K.K.) was spread thereon to form a layer of 620 nm thickness, and then subjected to baking at 130° C. for 90 seconds to prepare a substrate having a resist layer. The obtained substrate was subjected to exposure by a KrF exposure apparatus (FPA-EX5 [trademark], manufactured by Canon Inc.), and then developed to produce a developed resist substrate having line pattern.

As for the cases where the rinse solution contained a surfactant alone (Comparative Example 402) and where the solution contained both a surfactant and a sulfonic acid (Example 401), the evaluation was carried out in the above manner. The results were as set forth in Table 4.

Comparative Examples 501 to 502 and Example 501

An evaluation was carried out using a KrF resist composition and pure water as rinse solution (Comparative Example 501). Specifically, the procedure of Comparative Example 101 was repeated.

As for the cases where the rinse solution contained a surfactant alone (Comparative Example 502) and where the solution contained both a surfactant and a sulfonic acid (Example 501), the evaluation was carried out in the above manner. The results were as set forth in Table 4.

Comparative Examples 601 to 602 and Example 601

The procedure of Comparative Example 101 was repeated except for using a resist composition of immersion exposure type, to evaluate a pattern rinsed with pure water (Comparative Example 601). Specifically, a substrate having a resist layer was prepared in the following manner.

A silicon substrate was coated with a bottom anti-reflection layer-forming composition of immersion exposure type (ARC29SR [trademark], manufactured by Brewer Science inc.) and heated at 205° C. for 60 sec, to form an anti-reflection layer of 95 nm thickness. After that, an immersion resist composition (AY-2666 [trademark], manufactured by Sumitomo Chemical Co., Ltd.) was coated thereon and heated at 105° C. for 60 sec to form a resist layer of 110 nm thickness. Further, a topcoat composition (NFC TCX-041 [trademark], manufactured by JSR Corporation) was coated thereon and heated at 90° C. for 60 sec to form a topcoat layer of 90 nm thickness.

The obtained substrate was subjected to exposure by an immersion exposure apparatus (TWINSCAN XT1900i [trademark], manufactured by ASML Holding NV), and then developed with a developing machine (CLEAN TRACK ACT 12 [trademark], manufactured by Tokyo Electron Limited.) using 2.38% TMAH aqueous solution as a developer to produce a developed resist substrate having line pattern. The formed patterns were observed by CD-SEM CG4000 ([trademark], manufactured by Hitachi Ltd.)

As for the cases where the rinse solution contained a surfactant alone (Comparative Example 602) and where the solution contained both a surfactant and a sulfonic acid (Example 601), the evaluation was carried out in the above manner. The results were as set forth in Table 4.

(b) a sulfonic acid in which R is a 12-30 carbon atom-hydrocarbon group which may have a chain or cyclic structure, may have a branched chain, and may comprise a double or triple bond, provided that some or all of the hydrogen atoms in the hydrocarbon group may be replaced with hydroxides, sulfo groups or carboxyls, $$(R^1)_y\text{-Ph-SO}_3H \qquad (Ib)$$

in which Ph is a phenylene group; $R^1$ is a hydrogen atom or said hydrocarbon group which may have a chain or cyclic structure, may have a branched chain, and may comprise a double or triple bond, provided that some or all of the hydrogen atoms in the hydrocarbon group may be replaced with halogen atoms, hydroxides, sulfo groups or carboxyls; y is an integer satisfying the condition of $0 \leq y \leq 5$; if y is 2 or more, plural $R^1$s may be the same or different from each other; and the total number of carbon atoms is 12 to 30,

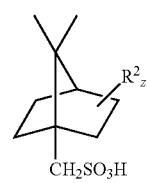

(Ic)

in which $R^2$ is selected from a hydrogen atom or said hydrocarbon group which may have a chain or cyclic structure, may have a branched chain, and may comprise a double or triple bond, provided that some or all of the hydrogen atoms in the hydrocarbon group may be replaced with halogen atoms,

TABLE 4

| | | Rinse solution | | Surface defects | | | | |
| | | alkylsulfonic acid | Surfactant | Pattern collapse | | | Number of | |
| | Resist composition | mixture Conc. (%) | S-1 Conc. (%) | Aspect ratio | Grade | LWR (nm) | foreign substances | Grade |
|---|---|---|---|---|---|---|---|---|
| Com. 401 | KrF | — | — | 3.4 | C | N/A | 482 | C |
| Com. 402 | KrF | — | 0.2 | 4.6 | B | N/A | 48 | A |
| Ex. 401 | KrF | 0.5 | 0.2 | 5.5 | A | N/A | 16 | A |
| Com. 501 | ArF | — | — | 3.0 | C | 5.5 | >10000 | C |
| Com. 502 | ArF | — | 0.2 | 4.8 | B | 4.8 | 580 | B |
| Ex. 501 | ArF | 0.5 | 0.2 | 6.1 | A | 3.9 | 32 | A |
| Com. 601 | Immersion | — | — | 3.0 | C | 5.2 | >30000 | C |
| Com. 602 | Immersion | — | 0.2 | 4.8 | B | 4.5 | 3416 | C |
| Ex. 601 | Immersion | 0.5 | 0.2 | 6.1 | A | 3.8 | 34 | A |

N/A: not

The invention claimed is:

1. A rinse solution for lithography, which consists of at least a sulfonic acid, a nonionic surfactant having an alkyleneoxy group, water and optionally an alcohol or glycol, wherein said sulfonic acid is selected from those represented by the following formulas (I); (1b); (1c) where:

$$R\text{—SO}_3H \qquad (I)$$

wherein the sulfonic acid of formula (I) is selected from the group consisting of:
  (a) a sulfonic acid having formula (Ia):

$$C_nH_{2n+1-x}F_xSO_3H \qquad (Ia)$$

in which n is an integer of 12 to 30; and x is an integer satisfying the condition of $0 \leq x \leq 2n+1$; and hydroxides, sulfo groups, and carboxyls; z is an integer satisfying the condition of $0 \leq z \leq 5$; if z is 2 or more, plural $R^2$s may be the same or different from each other; and the total number of carbon atoms is 30 or less.

2. The rinse solution for lithography according to claim 1, wherein said sulfonic acid is selected from those having formulas (I) or (1b).

3. The rinse solution for lithography according to claim 1 wherein said sulfonic acid is selected from those having formula (Ib).

4. The rinse solution for lithography according to claim 1, wherein the content of said sulfonic acid is in the range of 0.005 to 10% based on the total weight of said rinse solution.

5. The rinse solution for lithography according to claim 1, wherein said nonionic surfactant is represented by the following formula (IIa) or (IIb):

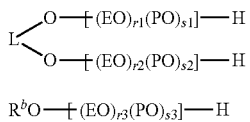

in which
- EO and PO represent —(CH$_2$)$_2$—O— and —CH$_2$—CH(CH$_3$)—O—, respectively, provided that the units of each of EO and PO may combine with each other either randomly or to form a block;
- L is a 1 to 30 carbon atom-hydrocarbon chain which may contain an unsaturated bond;
- R$^b$ is a saturated or unsaturated hydrocarbon chain of 5 to 30 carbon atoms;
- each of r1 to r3 and s1 to s3 is an integer of 20 or less for indicating the repeating degree of EU and PO, respectively, and each of r1+s1 and r2+s2 is independently an integer of 0 to 20 provided that r1+s1+r2+s2 is an integer of 1 or more; and
- r3+s3 is an integer of 1 to 20.

6. The rinse solution for lithography according to claim 1, wherein the content of said surfactant is in the range of 0.01 to 5% wt % based on the total weight of said rinse solution.

7. A pattern formation method comprising the steps of:
(1) coating a substrate with a photosensitive resin composition to form a photosensitive resin composition layer,
(2) subjecting said photosensitive resin composition layer to exposure,
(3) developing the exposed substrate with a developing solution, and
(4) treating the substrate with the rinse solution for lithography according to claim 1.

8. The rinse solution for lithography according to claim 1 wherein said sulfonic acid is chosen from the group consisting of dodecyl sulfonic acid, tetradecyl sulfonic acid, hexadecyl sulfonic acid, icosenyl sulfonic acid, 1-hydroxy-n-octyl sulfonic acid, 1,8-disulfo octane, and perfluorodecyl sulfonic acid.

9. The rinse solution for lithography according to claim wherein said sulfonic acid is chosen from the group consisting of dodecyl sulfonic acid, and hexadecyl sulfonic acid.

10. The rinse solution for lithography according to claim 1 wherein the sulfonic acid represented by formula (Ic) has a total number of carbon atoms of 20 to 30.

11. The rinse solution for lithography according to claim 1 wherein the sulfonic acid represented by the following formula (Ic) is chosen from the group consisting of include 3-bromo-10-camphor sulfonic acid, and 1-sulfoethyl norbornane.

12. The rinse solution for lithography according to claim 4 wherein the content of said sulfonic acid is in the range of 0.01 to 5% based on the total weight of said rinse solution.

13. The rinse solution for lithography according to claim 12 wherein the content of said sulfonic acid is in the range of 0.02 to 2% based on the total weight of said rinse solution.

14. The rinse solution for lithography according to claim 5, wherein the nonionic surfactant is represented following formula (IIa) and further wherein L is represented by the formula:

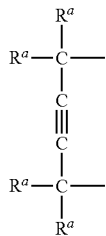

in which R$^a$ is independently selected from the group consisting of saturated, unsaturated, straight chain, and branched chain hydrocarbons of 3 to 10 carbon atoms, and further wherein a hydrogen atom on the hydrocarbon chain can optionally be substituted with OH.

15. The rinse solution for lithography according to claim 14, where the surfactant is acetylene glycol.

16. The rinse solution for lithography according to claim 1, wherein the content of said surfactant is in the range of 0.01 to 5 wt % based on the total weight of said rinse solution.

17. The rinse solution for lithography according to claim 1, wherein the content of said surfactant is in the range of 0.02 to 2 wt % based on the total weight of said rinse solution.

* * * * *